US006319023B2

(12) United States Patent
Goto et al.

(10) Patent No.: US 6,319,023 B2
(45) Date of Patent: Nov. 20, 2001

(54) PRESS-FIT ELECTRICAL CONNECTOR

(75) Inventors: Kazuhiro Goto, Markham; Andras Gymes, Toronto; Dragos Luca, Don Mills, all of (CA)

(73) Assignee: Tyco Electronics Canada Ltd, Ontario (CA)

( * ) Notice: Subject to any disclaimer, the term of this patent is extended or adjusted under 35 U.S.C. 154(b) by 0 days.

(21) Appl. No.: 09/728,927

(22) Filed: Dec. 1, 2000

Related U.S. Application Data

(60) Provisional application No. 60/168,485, filed on Dec. 2, 1999.

(51) Int. Cl.[7] .............................. H01R 12/00; H05K 1/00

(52) U.S. Cl. ................................................................ 439/79

(58) Field of Search ................................ 439/79, 751, 84, 439/752, 695

(56) References Cited

U.S. PATENT DOCUMENTS

| | | | | |
|---|---|---|---|---|
| 4,857,017 | * | 8/1989 | Erk | 439/695 |
| 4,955,819 | * | 9/1990 | Harting et al. | 439/79 |
| 5,249,974 | * | 10/1993 | Wang | 439/79 |
| 5,252,080 | * | 10/1993 | Pesson | 439/79 |
| 5,833,475 | * | 11/1998 | Mitra | 439/79 |

* cited by examiner

*Primary Examiner*—Brian Sircus
*Assistant Examiner*—Brian S. Webb

(57) ABSTRACT

An enclosure 10 is provided having a pin holder assembly 20 which may be latched into enclosure 10 via latching arms 24 and latching shoulders 14. Fins 15 are inserted into slots 25 and back-up press fit pins 21 in pin holder assembly 20. Fins 15 secure press fit pins 21 so as to withstand insertion forces required to attach enclosure 10 to a substrate. Pins 21 may be stitched into pin holder assembly 20 and then bent at right angles within slots 25.

19 Claims, 8 Drawing Sheets

PRESS-FIT ELECTRICAL CONNECTOR

This application claims the benefit of U.S. Provisional Application(s) No(s). 60/168,485, filed Dec. 2, 1999.

FIELD OF THE INVENTION

The present invention is related to electrical connectors and headers having press fit electrical terminals for connection to a substrate, such as a printed circuit board.

BACKGROUND OF THE INVENTION

Electrical connectors and headers having press fit electrical terminals enjoy popularity, in part due to the ease in which they may be assembled to a substrate such as a printed circuit board. Such press fit components allow users to electrically interconnect an electrical connector or header to a substrate by merely inserting the press fit terminals through plated through-holes provided on the substrate and firmly urging the terminals into an interference fit with said through-holes. One example of a press fit terminal is AMP Incorporated's ACTION PIN® terminal. This type of an arrangement eliminates the need for costly soldering procedures such as through-hole soldering or surface mount soldering of the electrical terminals which are mounted to the substrate. Of course, press fit terminals experience significant forces upon insertion into a substrate. Because of this, press fit electrical terminals are commonly secured within the electrical connector or header by means of over-molding processes which reliably secure the electrical terminals within the connector or header housing. Unfortunately, over-molding press fit electrical terminals is a difficult and costly process which adds to the overall cost of the end product.

Accordingly, it would be desirable to provide an electrical connector or housing equipped with press fit electrical terminals which are reliably secured within the connector or header housing and are capable of withstanding the significant insertion forces required to assemble the device to a substrate, but which does not require the expensive process of overmolding the press fit electrical terminals within the connector or header housing.

SUMMARY OF THE INVENTION

An embodiment of the present invention provides an electrical assembly comprising pins having a body disposed between a contacting portion and a press-fit portion. A pin holder is provided having apertures in communication with slots wherein the body of each pin is disposed through one of the apertures and into one of the slots. The press-fit portions extend beyond the apertures and outside of the pin holder. While a housing is secured to the pin holder such that fins on the housing are disposed within the slots to secure the bodies of the pins therein.

Another embodiment of the present invention provides an electrical connector assembly comprising a housing having at least one fin. At least one pin is disposed in a pin holder having at least one aperture in communication with at least one slot. The pin holder is secured to the housing such that the at least one fin is received within the at least one slot thereby enclosing at least a portion of the at least one pin between the pin holder and the at least one fin.

Yet another embodiment of the present invention provides an electrical assembly comprising a pin holder having apertures in communication with slots. Pins having a body portion are disposed in each aperture and slot such that press-fit portions of the pins extend from the apertures. A housing is provided having fins which are disposed in the slots thereby capturing the body portions of each pin in each slot. And, a circuit board is secured to the press-fit portions of the pins.

BRIEF DESCRIPTION OF THE DRAWINGS

Embodiments of the present invention will now be described by way of example with reference to the accompanying drawings in which:

FIG. 5 is an exploded isometric view of a pin holder assembly and enclosure of the present invention;

DETAILED DESCRIPTION OF THE INVENTION

Figure 1:
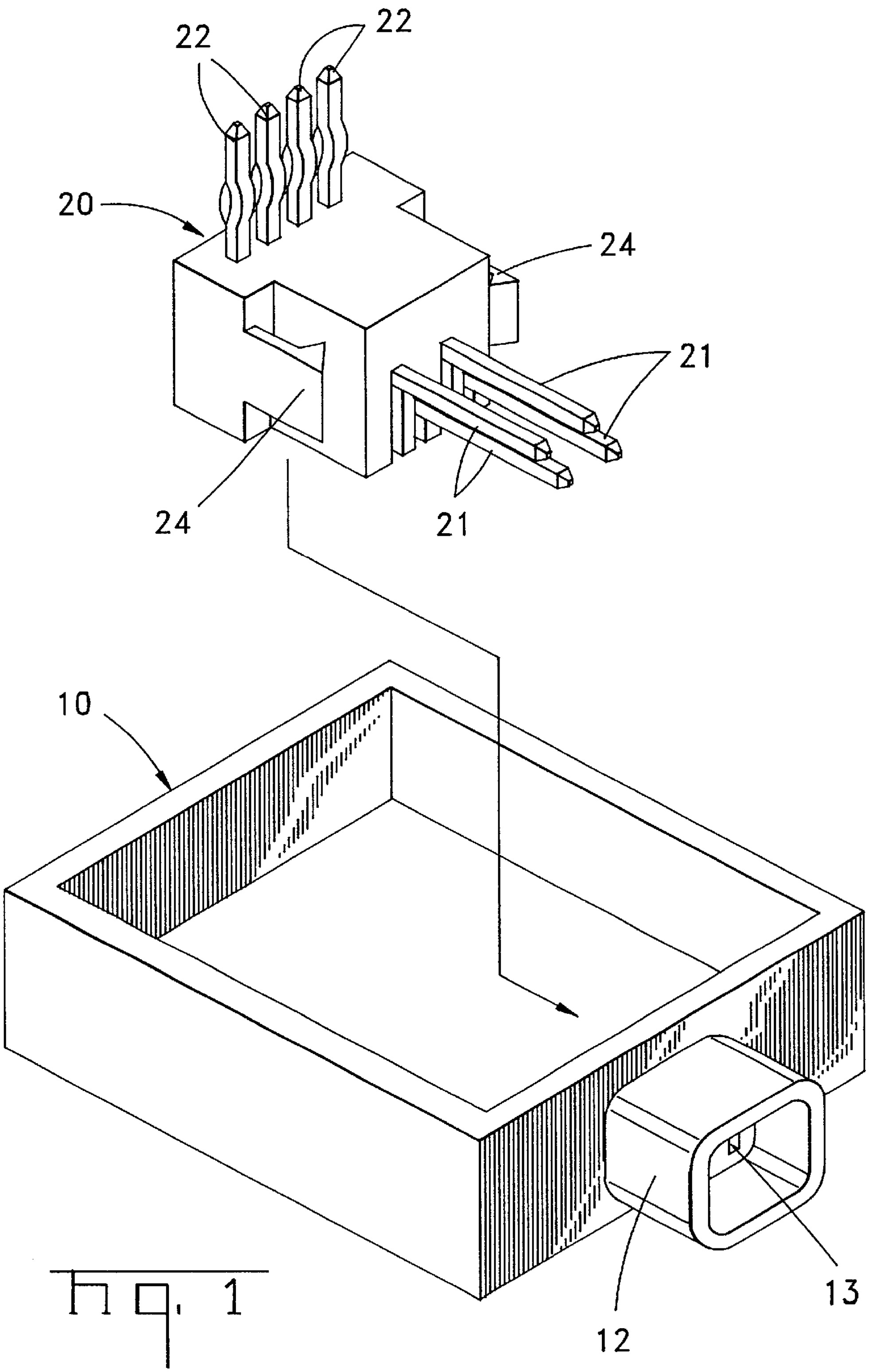
FIG. 1 is an exploded isometric view of one embodiment of a pin holder assembly and enclosure of the present invention.
Figure 4:
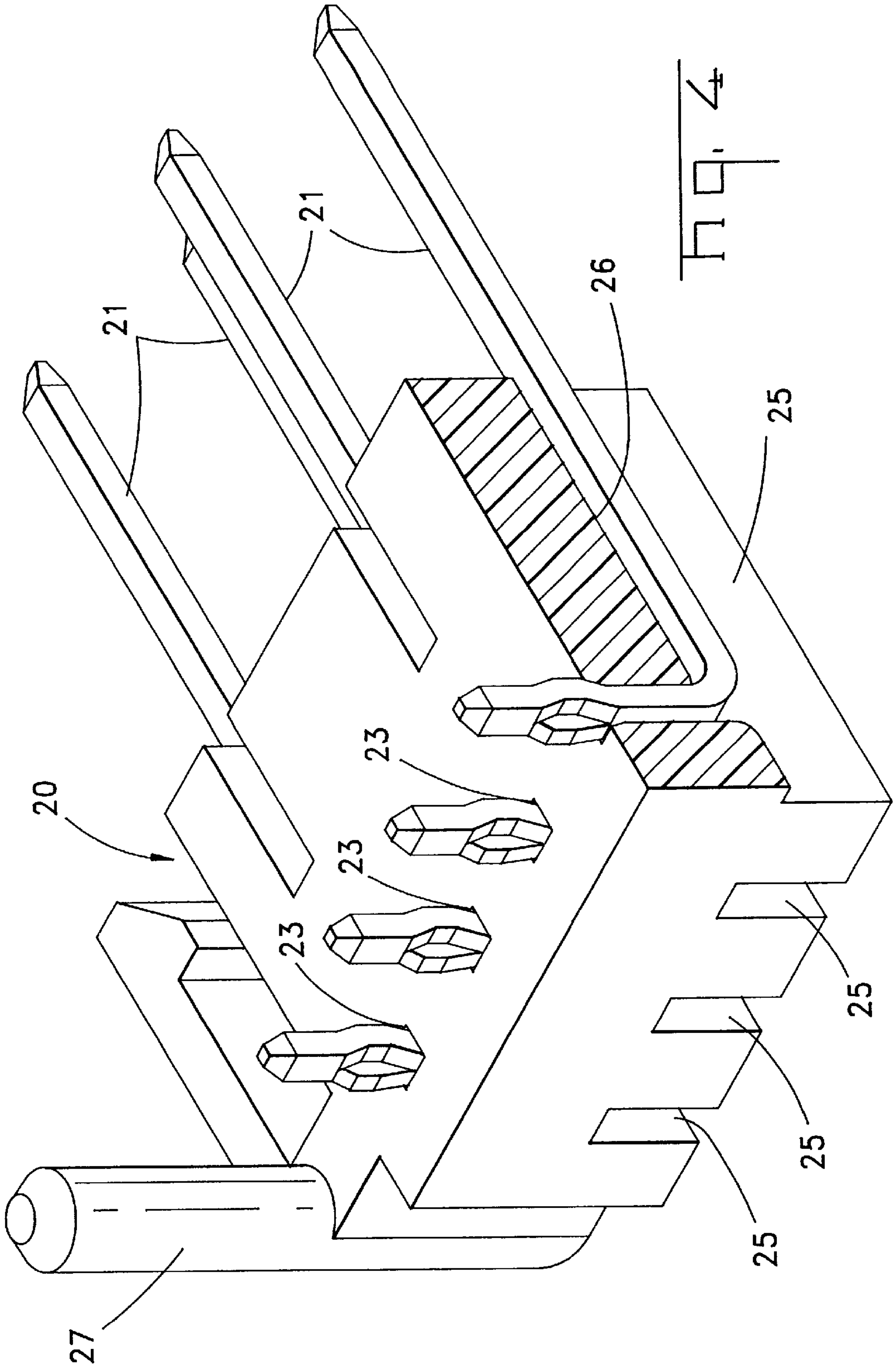
FIG. 4 is an isometric partial cut away view of a pin holder assembly of the present invention.

FIG. 1 shows an enclosure 10 having a shroud 12 which surrounds an array of passageways 13. A pin holder assembly 20 is shown having a plurality of pins 21 housed therein; each pin being configured with press fit terminals 22 suitable for attachment to a substrate. Pin holder assembly 20 is configured such that pins 21 are received through passageways 13 and pin holder assembly 20 is secured to an interior of the enclosure 10 by way of latch arms 24 and complimentary latching shoulders 14, best shown in FIG. 2. Pin holder assembly 20 is further comprised of a plurality of pin receiving apertures 23 which receive pins 21. The pins 21 extend through apertures 23 into slots 25. In one embodiment, pin holder assembly 20 is configured for right angle orientation of the pins within the pin holder assembly. FIG. 4 more clearly shows how pins 21 are situated within slots 25 after insertion through pin receiving apertures 23. Each slot 25 has a pin receiving surface 26 upon which pins 21 are fitted. In the present embodiment, pins 21 are bent at a right angle after insertion through pin receiving apertures 23 such that pins 21 bear against pin receiving surfaces 26 within slots 25.

Figure 6:
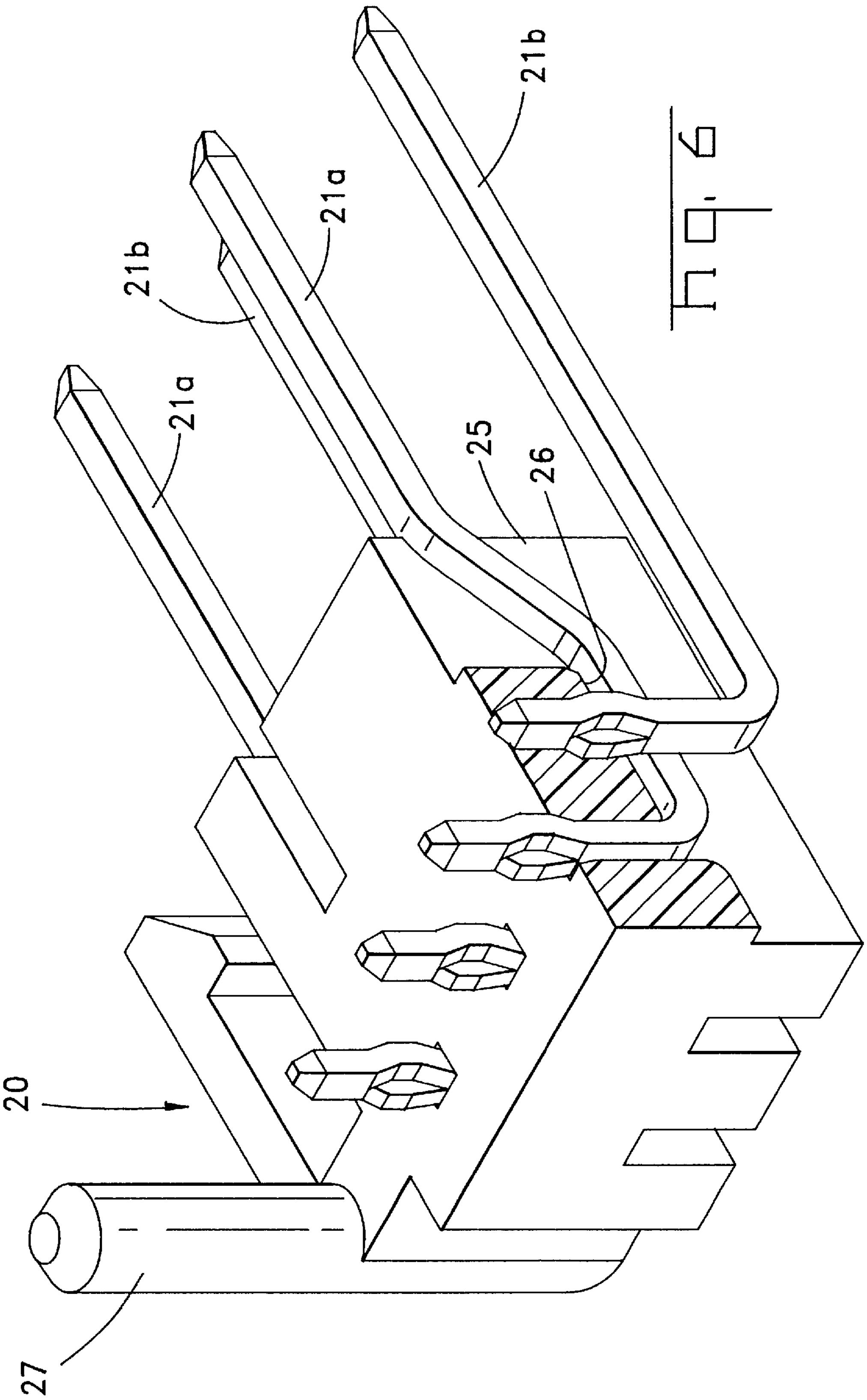
FIG. 6 is an isometric partial cut away view of a pin holder assembly of the present invention.
Figure 7:
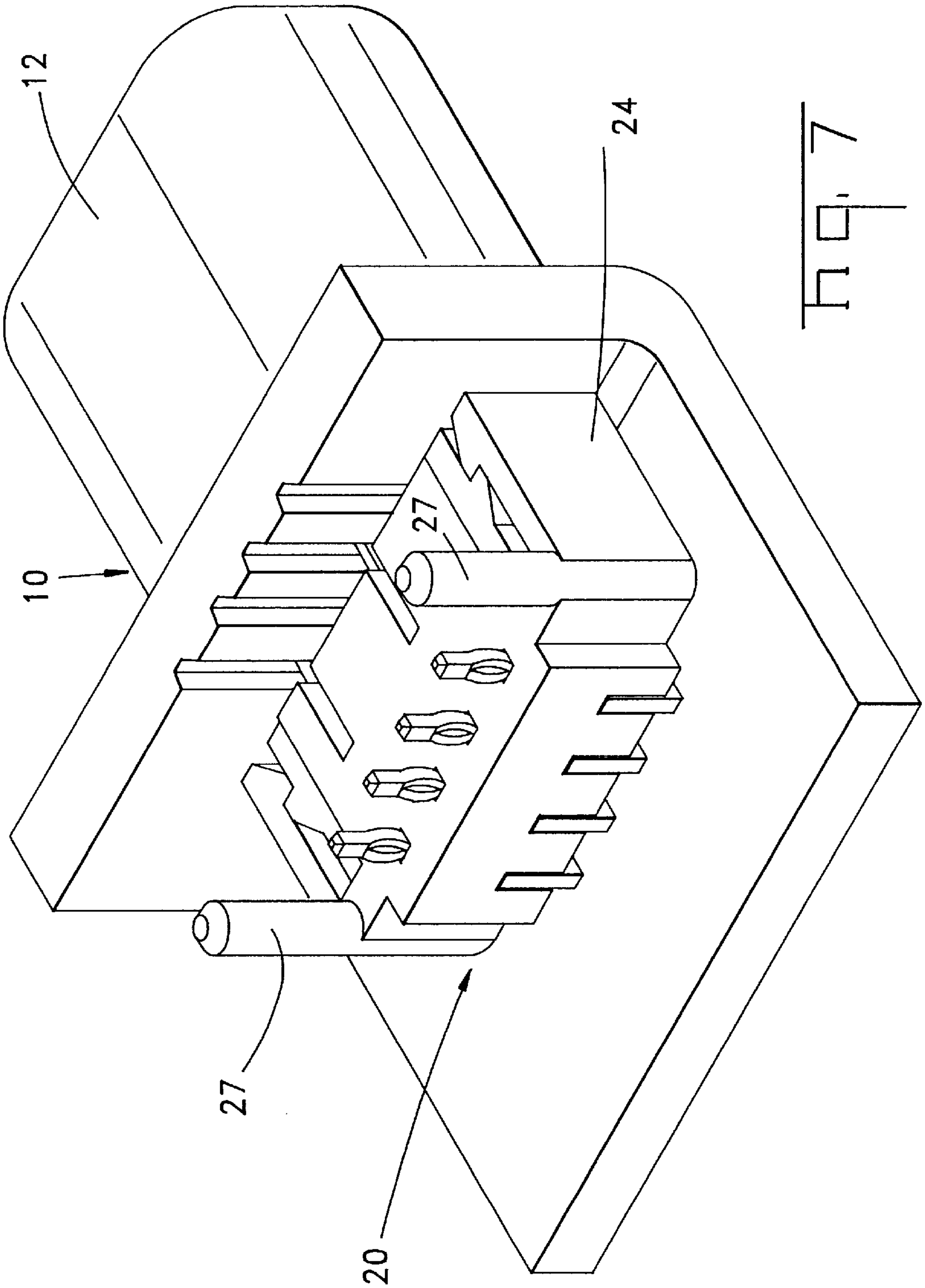

As shown in FIG. 5, enclosure 10 is furnished with fins 15 which extend from passageways 13 and along enclosure base 11 toward an interior of the enclosure 10. In the embodiment shown in FIG. 5, fins 15 have guide surfaces 16 which are configured to create a two row presentation of the pins upon insertion through passageways 13. That is, upon attachment of the pin holder assembly 20 to the enclosure 10, pins 21 become inserted through passageways 13 and fins 15 become situated within slots 25 such that pins 21 are secured between fins 15 and pin receiving surfaces 26. Pins 21 follow guide surfaces 16 through passageways 13 and, in the embodiment shown in FIG. 5, extend within the shroud 12 in a two row configuration. FIG. 6 shows a cut away view of pin holder assembly 20 wherein pin receiving surface 26 does not extend entirely within slot 25. This allows pins 21*a* to be offset from pins 21*b* which, as shown in FIG. 4, will be received within slots 25 having pin receiving surfaces 26 which extend through the entire slots 25. By extending pin receiving surface 26 only partially through slots 25 for receiving pins 21*a,* pins 21*a* may be influenced by guide surfaces 16 such that they are offset to provide a two row pin configuration within shroud 12.

Figure 7:
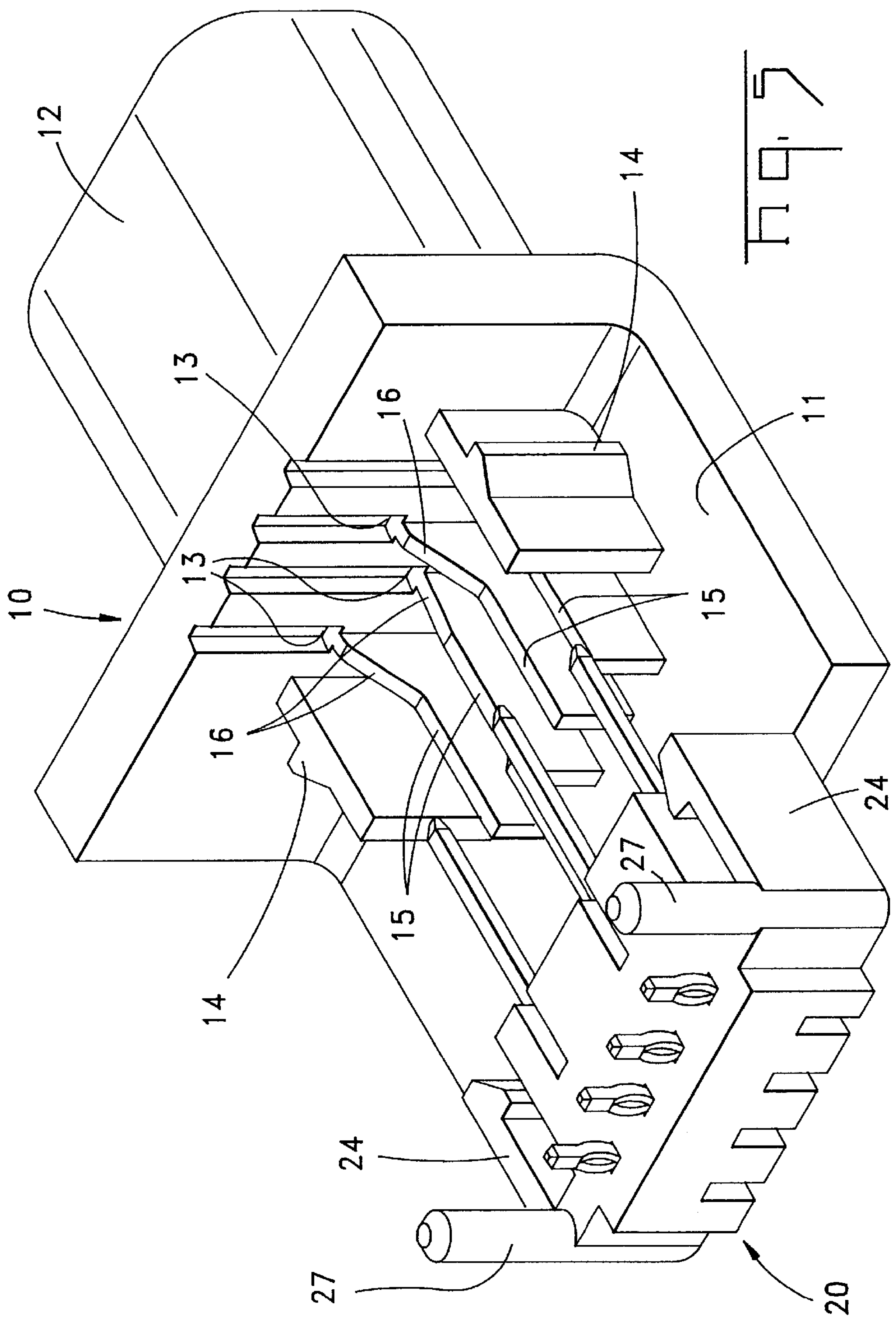
FIG. 7 is an isometric view of a pin holder assembly attached to an enclosure as described in the present invention.
Figure 8:
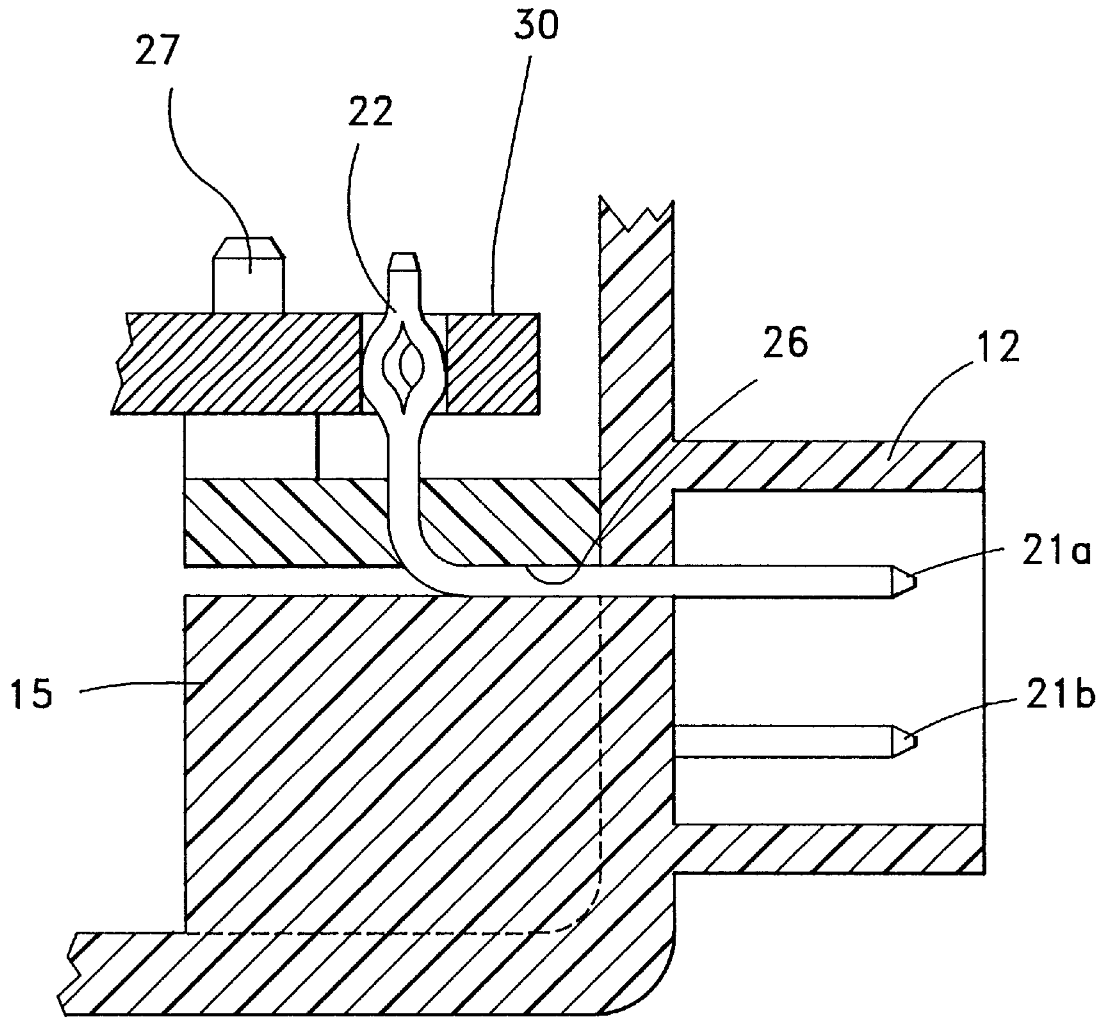
FIG. 8 is a cross-sectional side view of an enclosure attached to a pin holder assembly and secured to a substrate.

Attachment of pin holder assembly 20 to enclosure 10 is completed by latching arms 24 deflecting and then resiling into latched engagement with latching shoulders 14, as best shown in FIG. 7. Once pin holder assembly 20 is securely attached to enclosure 10, a substrate may be press fit upon press fit terminals 22, as shown in FIG. 8. Posts 27 may be employed to further secure the substrate to the pin holder assembly.

Figure 2:
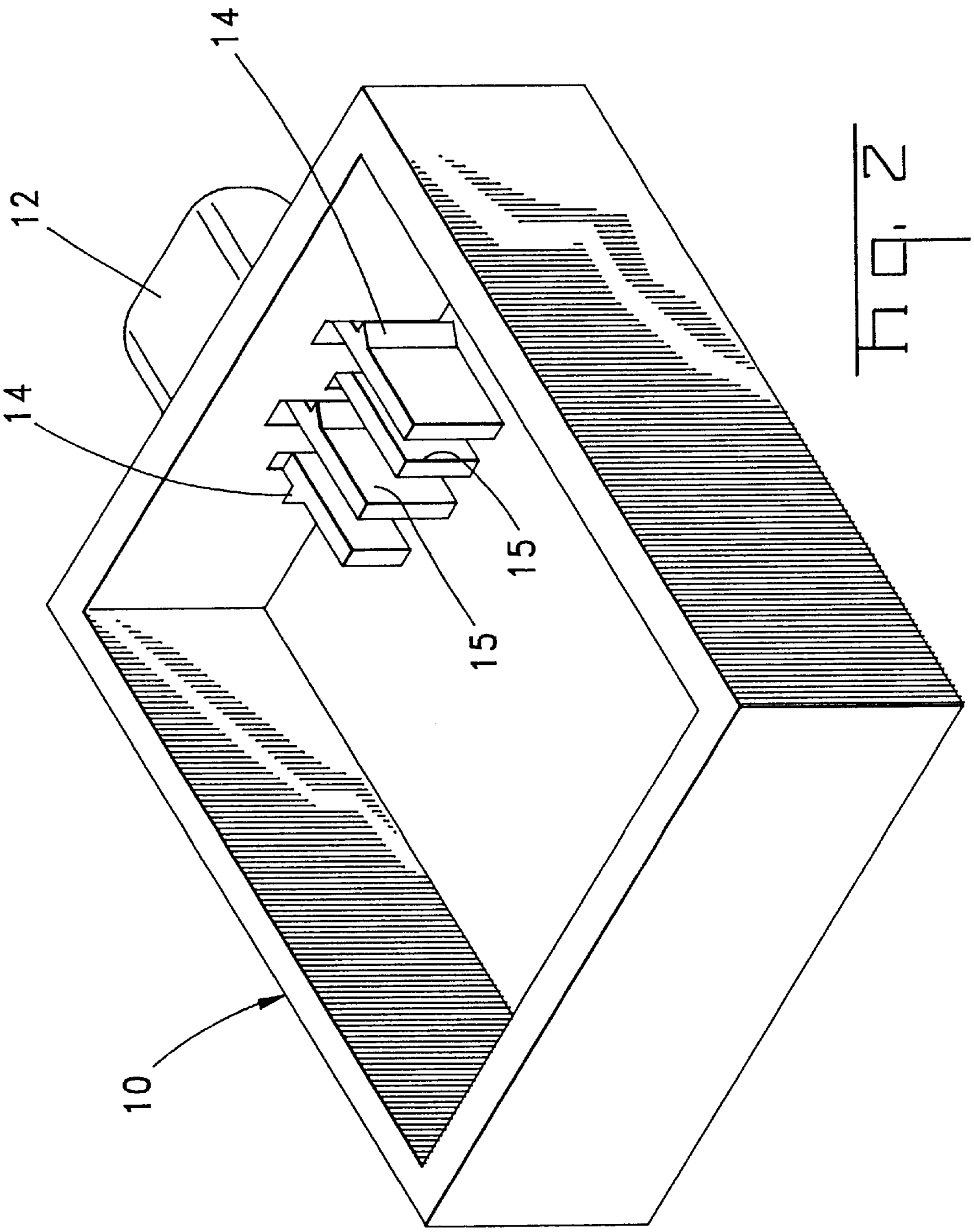
FIG. 2 is an isometric view of an embodiment of an enclosure of the present invention.
Figure 3:
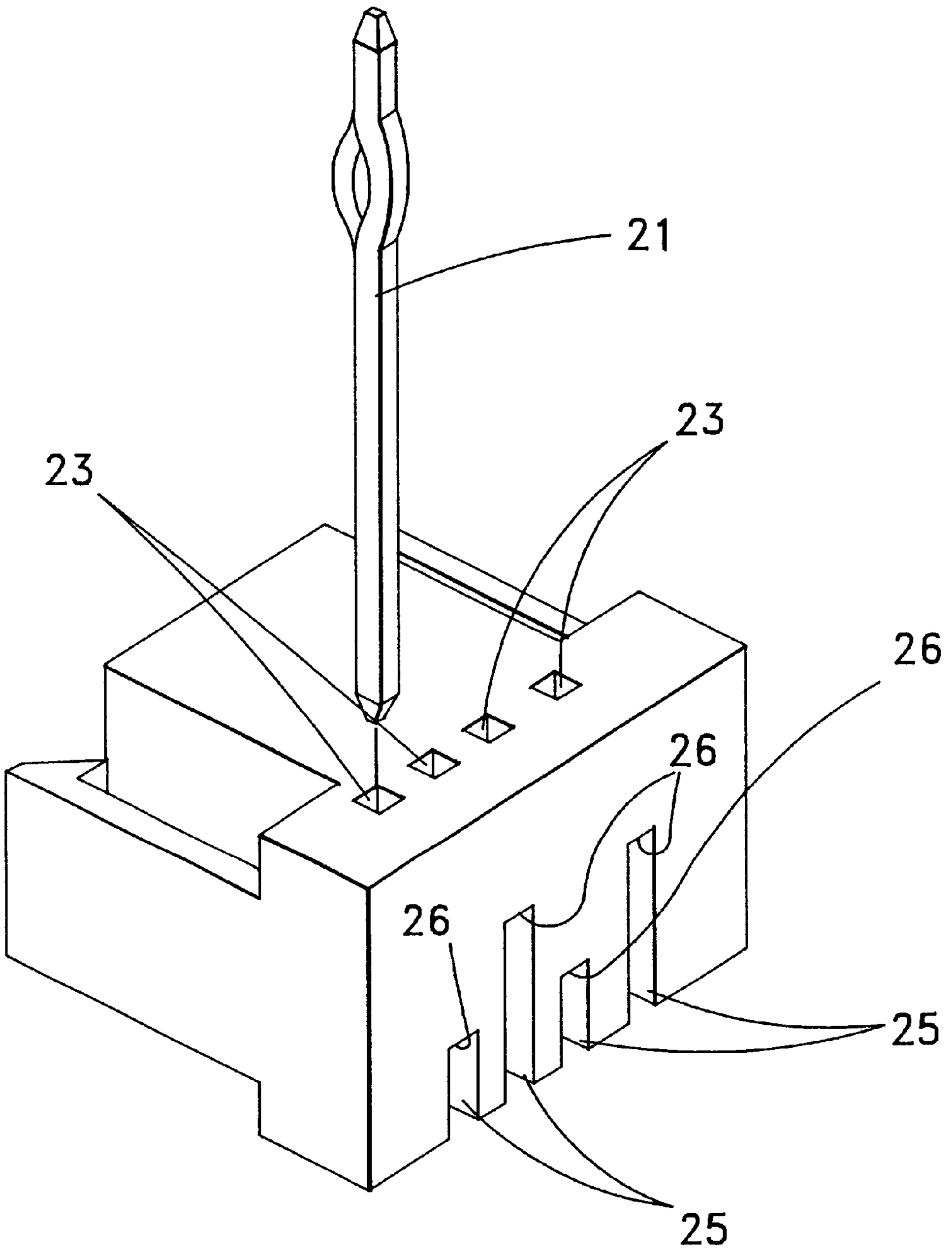
FIG. 3 is an exploded isometric view of a pin holder assembly of the present invention.

The arrangement of the present invention will protect pins 21 from being damaged upon insertion of the press fit terminals 22 into substrate 30 and will firmly secure the pins so that a reliable electrical connection can be made. As shown in FIG. 8, fins 15 backup pins 21 so that they are not displaced during insertion of the press fit terminals 22 into the substrate 30. Pins 21 are presented in two rows within shroud 12, as earlier described. FIG. 8, however, shows an alternative embodiment wherein guide surfaces 26 extend through slots 25 at varying depths, as further shown in FIG. 3. Fins 15, as best shown in FIG. 2, are complimentarily formed at varying heights to fit within slots 25. In such a configuration, tapered guide surfaces 16, as shown in FIG. 5, are unnecessary.

Although a two row pin presentation has been discussed herein, it should be apparent that single row or multirow presentations may be adapted by adjusting fin heights and slot depths accordingly. Furthermore, it should be apparent that the present invention is suitable for alternative orientations of pins 21 such that they are not configured at a right angle. Additionally, the configuration of enclosure 10 may be modified in many ways. For instance a planar surface adapted with fins would suffice to backup pins 21 which are fitted within a pin holder assembly.

The press fit electrical connector of the present invention and many of its attendant advantages will be understood from the foregoing description. It is apparent that changes may be made in the form, construction and arrangement of parts thereof without departing from the spirit of the invention, or sacrificing all of its material advantages.

We claim:

1. An electrical assembly comprising:

pins having a body disposed between a contacting portion and a press-fit portion;

a pin holder having apertures in communication with slots wherein the body of each pin is disposed through one of the apertures and into one of the slots, the press-fit portions extending beyond the apertures outside the pin holder, wherein the aperture and the slot are located at right angles to one another;

a housing secured to the pin holder, the housing having fins which are disposed within the slots to secure the bodies of the pins therein;

at least one of said fins having guide surfaces which contact the pins and displace the pins in a direction transverse to the direction of engagement of the pins with the fins, without changing the angular orientation of the pin.

2. The electrical assembly of claim 1 wherein the contacting portions extend beyond the slots outside of the pin holder.

3. The electrical assembly of claim 1 wherein the pin holder is secured to the housing by latches.

4. The electrical assembly of claim 1 wherein the fins disposed on the housing are of varying heights.

5. The electrical assembly of claim 1 wherein the slots are of varying depths.

6. The electrical assembly of claim 1 wherein the assembly is press-fitted to a circuit board by the press-fit portions of the pins.

7. The electrical assembly of claim 1 wherein the pin holder has posts for locating and securing the assembly onto a printed circuit board.

8. The electrical assembly of claim 1 wherein the fins have guide surfaces which cooperate with the pins to position the contact portions of the pins.

9. An electrical connector assembly comprising:

a housing having at least one fin;

at least one pin having a right angle orientation; and a pin holder having at least one aperture in communication with at least one slot, the at least one pin being disposed within the at least one aperture and the at least one slot, wherein the pin holder is secured to the housing such that the at least one fin is received within the at least one slot thereby enclosing at least a portion of the at least one pin between the pin holder and the at least one fin; wherein upon receipt of said at least one fin in said at least one slot, said at least one pin is displaced in a direction transverse to the direction of engagement of said at least one pin and said at least one fin without changing the angular orientation of the pin.

10. The electrical connector assembly of claim 9 wherein the at least one pin has a press-fit portion projecting from the pin holder.

11. The electrical connector assembly of claim 9 wherein the at least one pin has a contacting portion projecting from the pin holder.

12. The electrical connector assembly of claim 9 wherein the pin holder is secured to the housing by latches.

13. The electrical connector assembly of claim 9 wherein the at least one aperture is disposed at a right angle to the at least one slot.

14. The electrical connector assembly of claim 9 wherein the assembly is mounted to a printed circuit board.

15. An electrical assembly comprising:

a pin holder having apertures in communication with slots;

pins having a body portion disposed in each aperture and slot, the pins having press-fit portions extending from the apertures, said pins having a right angle orientation;

a housing having fins which are disposed in the slots thereby capturing the body portions of each pin in each slot, at least one of said fins comprising means for displacing the pins in a direction transverse to a direction of engagement of the pins with the fins without changing the angular orientation of the pins; and a circuit board secured to the press-fit portions of the pins.

16. The electrical assembly of claim 15 wherein the pin holder has posts for aligning and securing the pin holder to the circuit board.

17. The electrical assembly of claim 15 wherein the fins have guide surfaces which position contact portions of the pins.

18. The electrical assembly of claim 17 wherein the contact portions of the pins extend from the slots outside of the pin holder.

19. The electrical assembly of claim 18 wherein the contact portions project into a shroud disposed on the housing.

* * * * *